United States Patent
Zhang

(10) Patent No.: US 6,632,511 B2
(45) Date of Patent: Oct. 14, 2003

(54) MANUFACTURE OF PREPREGS AND LAMINATES WITH RELATIVELY LOW DIELECTRIC CONSTANT FOR PRINTED CIRCUIT BOARDS

(75) Inventor: Dong Zhang, Concord, NH (US)

(73) Assignee: Polyclad Laminates, Inc., West Franklin, NH (US)

( * ) Notice: Subject to any disclaimer, the term of this patent is extended or adjusted under 35 U.S.C. 154(b) by 0 days.

(21) Appl. No.: 10/035,975

(22) Filed: Nov. 9, 2001

(65) Prior Publication Data

US 2003/0091800 A1 May 15, 2003

(51) Int. Cl.[7] ............................... B32B 3/00; H05K 1/00
(52) U.S. Cl. .................... 428/209; 428/322.7; 428/326; 428/375; 174/258; 442/70; 442/131; 442/136
(58) Field of Search ................... 428/209, 375, 428/322.7, 326; 174/258; 442/70, 131, 136

(56) References Cited

U.S. PATENT DOCUMENTS

| | | | |
|---|---|---|---|
| 4,238,641 A | | 12/1980 | Planting et al. |
| 4,309,334 A | | 1/1982 | Valitsky |
| 4,610,495 A | | 9/1986 | Landi |
| 4,661,301 A | | 4/1987 | Okada et al. |
| 4,788,230 A | | 11/1988 | Mudge |
| 4,798,762 A | | 1/1989 | Okada et al. |
| 5,098,781 A | | 3/1992 | Minnick et al. |
| 5,103,293 A | * | 4/1992 | Bonafino et al. ............. 357/80 |
| 5,126,192 A | | 6/1992 | Chellis et al. |
| 5,308,909 A | | 5/1994 | Chen, Sr. et al. |
| 5,585,432 A | * | 12/1996 | Lee et al. ................... 524/494 |
| 5,670,250 A | | 9/1997 | Sanville, Jr. et al. |
| 6,042,936 A | | 3/2000 | Kempf |
| 6,337,463 B1 | * | 1/2002 | Gaku et al. ............. 219/121.7 |

FOREIGN PATENT DOCUMENTS

| | | |
|---|---|---|
| EP | 0 279 769 B1 | 8/1988 |
| EP | 0 570 094 B1 | 11/1993 |
| GB | 2 195 269 A | 4/1988 |
| JP | 02133436 A2 | 5/1990 |
| JP | 04055437 A2 | 2/1992 |
| JP | 04046224 B4 | 7/1992 |
| JP | 04366145 A2 | 12/1992 |

OTHER PUBLICATIONS

IBM Technical Disclosure Bulletin "Low Dielectric Constant Material for Printed Circuit Boards" Oct. 1979, p. 1799.

IPC–TM–650 Test Methods Manual "Permittivity (Dielectric Constant) and Los Tangent (Dissipation Factor) of Materials (Two Fluid Cell Method)" The Institute for Interconnecting and Packaging Electronic Circuits, Northbrook, IL, No. 2.5.5.3, Dec. 1987, 4 pages.

IPC–TM–650 Test Methods Manual "Resin Content of Prepreg, by Burn–off" The Institute for Interconnecting and Packaging Electronic Circuits, Northbrook, IL, No. 2.3.16, Dec. 1994, 1 page.

(List continued on next page.)

*Primary Examiner*—Cathy Lam
(74) *Attorney, Agent, or Firm*—Senniger, Powers, Leavitt & Roedel

(57) ABSTRACT

The present invention is directed to filled prepregs, laminates, printed circuit boards comprising a reinforcing material impregnated with a cured polymeric resin, the cured polymeric resin comprising multicellular polymeric microspheres as a filler. Pre-pregs, laminates and printed circuit boards prepared by this method have reduced dielectric constant as low as 3.0, depending upon the resin system of the matrix. In addition, such laminates and printed circuit boards have enhanced electrical, thermal and mechanical properties as well as improved machinability, low density and a uniform appearance.

65 Claims, 3 Drawing Sheets

(2 of 3 Drawing Sheet(s) Filed in Color)

OTHER PUBLICATIONS

IPC–TM–650 Test Methods Manual "Glass Transition Temperature and Z–Axis Thermal Expansion by TMA" The Institute for Interconnecting and Packaging Electronic Circuits, Northbrook, IL, No. 2.4.24, Dec. 1994, 3 pages.

IPC–TM–650 Test Methods Manual "Time to Delamination (TMA Method)" The Institute for Interconnecting and Packaging Electronic Circuits, Northbrook, IL, No. 2.4.24.1, Dec. 1994, 2 pages.

IPC–TM–650 Test Methods Manual "Peel Strength of Metallic Clad Laminates" The Institute for Interconnecting and Packaging Electronic Circuits, Northbrook, IL, No. 2.4.8, Dec. 1994, 3 pages.

IPC–TM–650 Test Methods Manual "Glass Transition Temperature and Cure Factor by DSC" The Institute for Interconnecting and Packaging Electronic Circuits, Northbrook, IL, No. 2.4.25, Dec. 1994, 3 pages.

IPC–TM–650 Test Methods Manual "Peel Strength of Metallic Clad Laminates at Elevated Temperature (Hot Fluid Method)" The Institute for Interconnecting and Packaging Electronic Circuits, Northbrook, IL, No. 2.4.8.2, Dec 1994, 3 pages.

IPC–TM–650 Test Methods Manual "Flammability of Laminate" The Institute for Interconnecting and Packaging Electronic Circuits, Northbrook, IL, No. 2.3.10, Dec. 1994, 3 pages.

* cited by examiner

MANUFACTURE OF PREPREGS AND LAMINATES WITH RELATIVELY LOW DIELECTRIC CONSTANT FOR PRINTED CIRCUIT BOARDS

FIELD OF THE INVENTION

This invention generally relates to prepreg and laminate compositions for use in forming printed circuit boards having a reduced and uniform dielectric constant, improved thermal stability and thermal expansion characteristics, uniform appearance, low density and improved drillability.

BACKGROUND OF THE INVENTION

The printed circuit board (PCB) is central to the electronic systems of modern devices, which typically have high signal speeds and operating frequencies. The circuit boards made of materials with low dielectric constants permit the speed of electronic signal transmission in the laminates to be increased and data to be processed at greater speeds. Thus, by using a printed circuit board with a lower dielectric constant, the system may be designed with a higher speed of processing electric signals. Since the dielectric constant of the material from which the PCB is formed has a direct effect on the performance and speed of circuits built on the board, the increased electrical performance and the demand for increased speed required of PCBs in modern devices has prompted a search for ways to reduce the dielectric constant of the materials from which they are made.

Printed circuit boards are typically produced by impregnating a fabric, such as an electronics grade fiber glass (E-glass) with a liquid thermosetting epoxy resin. The impregnated fabric is heated to partially cure the resin and to form a dry, flexible sheet in which the resin is in an intermediate cure state, sometimes referred to as the "B" stage or a "pre-preg." Pre-preg sheets are then stacked together to a desired thickness and subjected to heat and pressure that fully cures the resin. This forms a laminated composite in which the resin is sometimes said to be in the "C"-stage.

Typically, printed circuit boards consist of about 50% by weight epoxy and 50% by weight electronics grade fiber glass (E-glass). The typical dielectric constant of the laminate at 50% resin content is about 4.6, a value which is insufficiently low to satisfy the demands of the most high speed computers currently being developed.

To reduce the dielectric constant of printed circuit board, polymeric resins such cyanate esters, polyimides, BT/epoxy, polyphenylene ether, and PTFE which have a dielectric constant which is less than the dielectric constant of epoxy have been considered, but they tend to be relatively expensive or suffer from other disadvantages. For example, PCBs made from PTFE may have a dielectric constant of approximately 2.5 at 1 MHZ, but they are relatively expensive and difficult to manufacture, composites impregnated with PTFE are difficult to fabricate into multilayer printed circuit boards, and pre-preg sheets prepared with PTFE can be bonded only at temperatures at which innerlayers melt and lose their dimensional stability, and they have relatively poor mechanical properties because they are not thermosetting. Laminates prepared using polyphenylene oxide/brominated epoxy resins (PPO/Epoxy) are relatively less expensive than PTFE, but the dielectric constant, Dk, of the laminate, however, is typically about 4.0 and the product is relatively to difficult to consistently manufacture, as the composition of the resin tends to fluctuate from run to run.

Fibers formed from materials other than fiberglass have also been considered as a means to reduce the dielectric constant of the laminate. Aramid fibers together with epoxy resins typically provide laminates with a dielectric constant in the range of about 3 to 4. Although aramid fibers have a low dissipation factor, low mechanical strength, poor adhesive properties and relatively high expense are also associated with these systems. Quartz fibers have also been used, but like aramid fibers they are relatively expensive compared to conventional E-glass. Polyester fibers have a dielectric constant of less than 3, but they tend to suffer from low resistance to heat and a tendency to melt and loose their desirable properties at higher temperatures; polyester fibers has a lower strength relative to glass fiber, which yields less mechanical properties such as dimensional stability.

Okada et al. (U.S. Pat. No. 4,798,762) disclose adding a filler material to resin to reduce the dielectric constant of a laminate in a process in which a hardened plate is extruded and then laminated on opposite sides to preimpregnated reinforcing fibers. According to Okada et al., it is advantageous to use hollow microspheres of alumina, silica, zirconia, glass, carbon and phenol resin. Okada et al.'s preferred filler consists of hollow glass microspheres of 20–150 micrometers in diameter having a glass thickness 0.5–2 micrometers with the volume fraction of filler based on the total volume of the center plate being 0.3 to 0.8, more preferably 0.5 to 0.7. See, U.S. Pat. No. 4,798,762 at col. 3, lines 23–31.

The use of glass microspheres as a filler material to reduce the dielectric constant of the laminate, however, is not without disadvantages. Because the glass shell has a relatively high dielectric constant and somewhat offsets the very low dielectric constant gas which is incorporated within the hollow shell, a relatively high loading of the glass microspheres is required to provide a relatively low dielectric constant laminate. Also, the interface adhesion between the glass microspheres and the resin matrix is often unsatisfactory, leading to thermal, mechanical and distribution problems. Because hollow microspheres are buoyant and relatively hard to disperse, additional equipment for continuous agitation is required to keep them suspended Chellis et al. (U.S. Pat. No. 5,126,192) disclose that smaller glass microspheres are less buoyant than are larger microspheres. For this reason, Chellis et al. prefer using microspheres having a maximum diameter of about 25 micrometers with a mean diameter of about 5 micrometers. Nevertheless, Chellis et al. require continuous agitation to keep them suspended and suggest using low-shear mixing techniques to minimize damage to the microspheres. See U.S. Pat. No. 5,126,192 at column 4, line 65 to column 5, line 3 and column 6, lines 20–30.

SUMMARY OF THE INVENTION

Among the objects of the invention, therefore, is the provision of a prepreg and a laminate which comprises an alternative filler to the traditional glass microspheres, which has a relatively low and uniform dielectric constant, improved thermal expansion characteristics, which minimizes through hole failure, and is flame retardant and easily processable.

Briefly, therefore, the present invention is directed to a filled prepreg composition for use in forming printed circuit boards. The prepreg comprises a reinforcing material impregnated with a cured polymeric resin, the cured polymeric resin comprising multicellular polymeric microspheres as a filler. Incorporation of the multicellular polymeric microspheres advantageously enables the preparation of laminates and printed circuit boards having a relatively low and uniform dielectric constant, improved thermal stability and thermal expansion characteristics, uniform appearance, low density and improved drillability.

Other objects of the invention will be in part apparent and in part pointed out hereinafter.

BRIEF DESCRIPTION OF THE DRAWINGS

The file of this patent contains at least one drawing executed in color.

DESCRIPTION OF THE PREFERRED EMBODIMENTS

In accordance with the present invention, it has been discovered that laminates and printed circuit boards having a relatively low and uniform dielectric constant, improved thermal expansion characteristics, minimize through hole failure, are flame retardant and easily processable may be prepared using a multicellular microsphere filler. In general, the multicellular microspheres comprise at least two cavities, wherein the cavities may be open or closed to the environment surrounding the microsphere. In one embodiment, the multicellular microspheres comprise a foamed polymeric material having a multiplicity of cavities, wherein some of the cavities are open to the surrounding environment (i.e., is a macroporous material) and others are closed to the surrounding environment.

Figure 1:
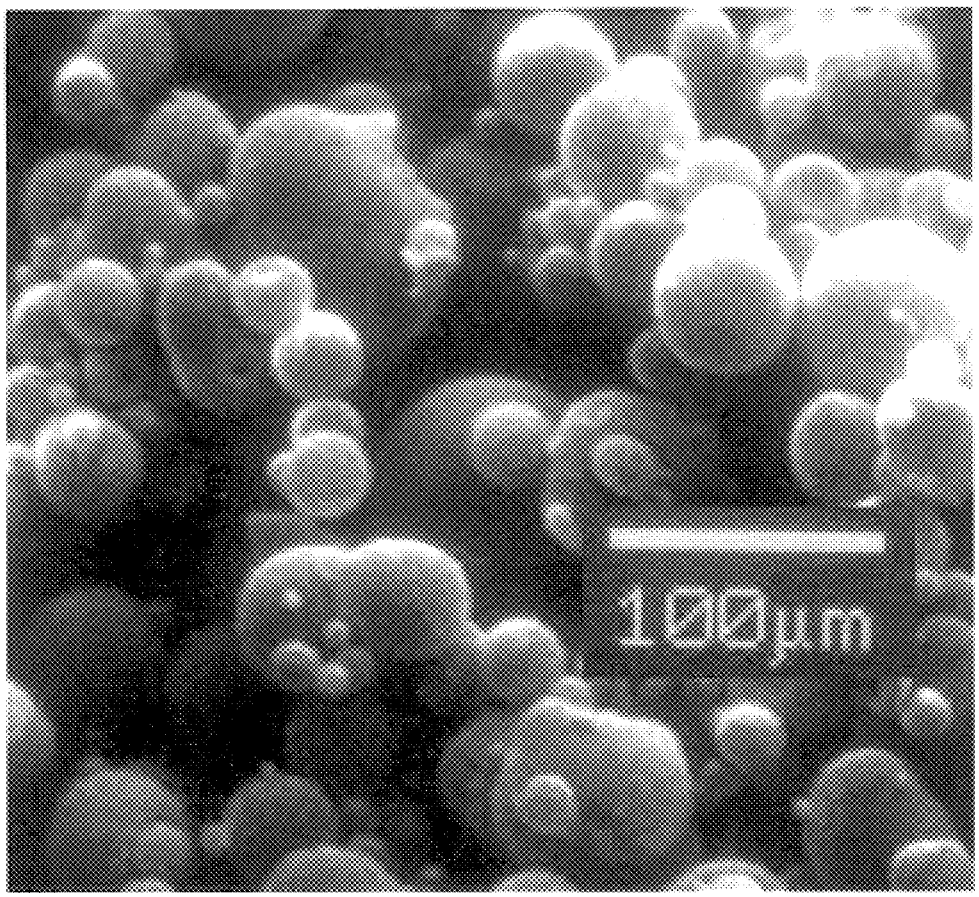
FIG. 1 is an SEM micrograph (at 100×magnification) depicting a mass of multicellular polymeric microspheres useful in the preparation of pre-pregs, laminates and printed circuit boards of the present invention, the mass including microspheres of different sizes. In the diagram, the microspheres are denoted as the white spherical objects on the rounded surface.
Figure 2A:
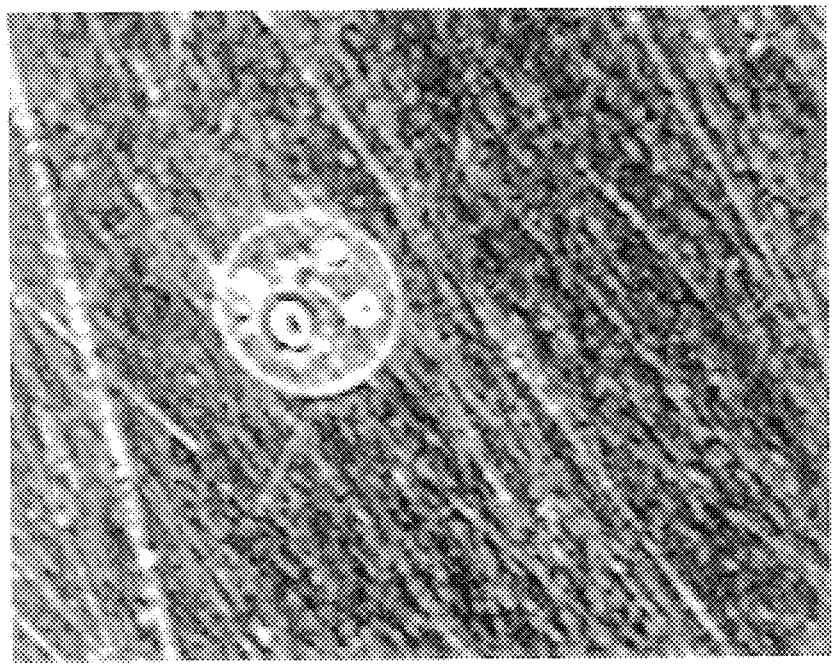
FIGS. 2a–2d are series of micrographs (at 200× magnification) depicting the cross section of a multicellular polymeric microsphere useful in the preparation of pre-pregs, laminates and printed circuit boards of the present invention.
Figure 2B:
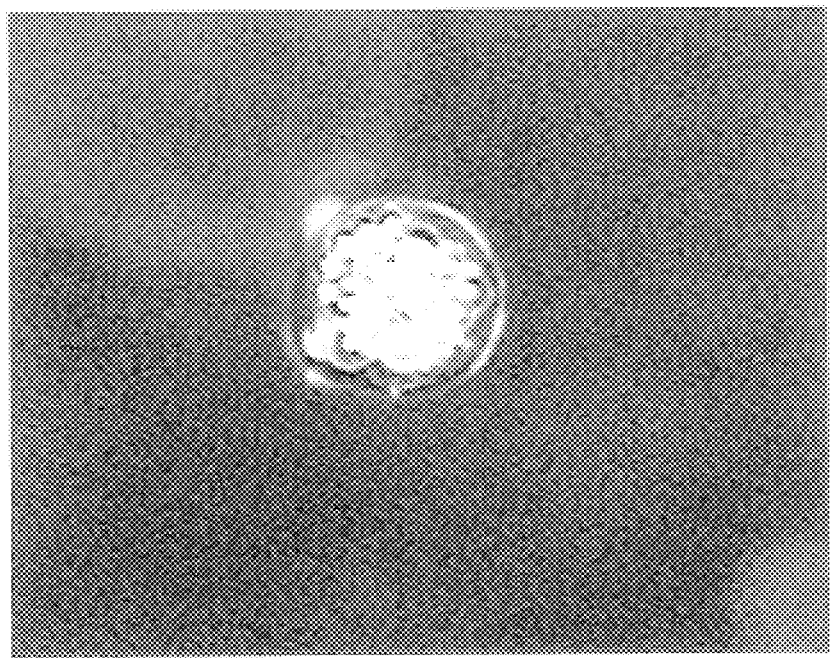
Figure 2C:
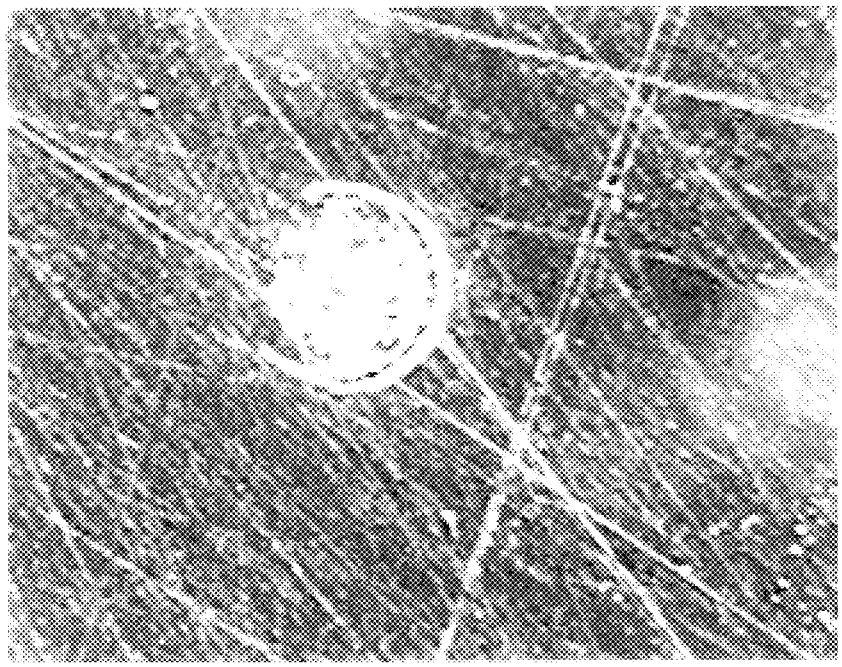
Figure 2D:
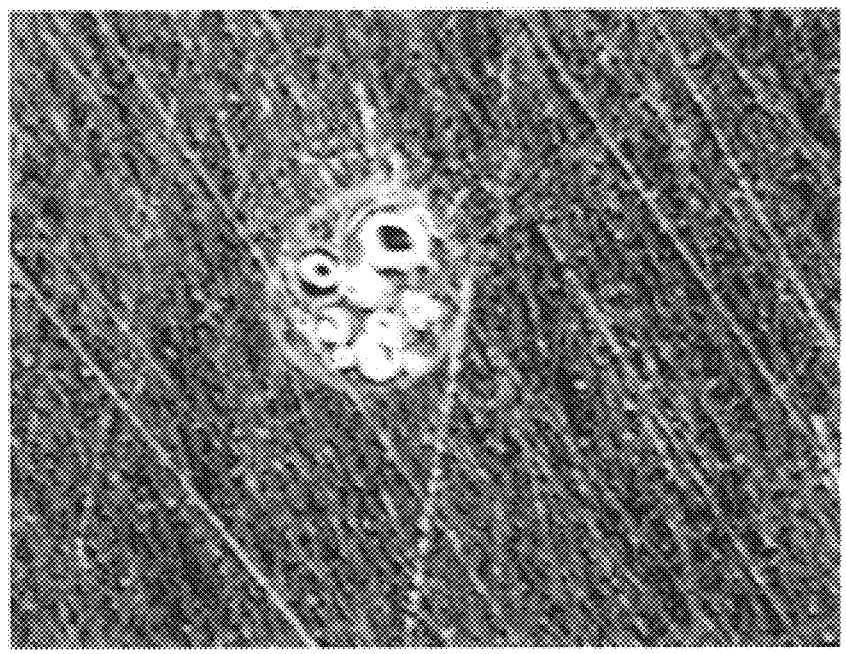

In general, the properties of the pre-pregs, laminates and printed circuit boards improve as the median size of the multicellular microspheres decreases and the uniformity of microsphere size increases. Preferably, therefore, the microspheres incorporated into the pre-pregs, laminates and printed circuit boards of the present invention have a mean particle of no more than 70 micrometers, more preferably a mean particle size of no greater than 50 micrometers, still more preferably a mean particle size of no greater than 25 micrometers and still more preferably a mean particle size of no greater than 10 micrometers. For example, in one embodiment, the median size of the microsphere is no greater than 25 micrometers and at least 95% of the microspheres have a size less than 70 micrometers. In another more preferred embodiment, the median size of the microsphere is no greater than 10 micrometers and at least 95% of the microspheres have a size less than 25 micrometers. In another more preferred embodiment, the median size of the microsphere is no greater than 5 micrometers and at least 95% of the microspheres have a size less than 10 micrometers. FIG. 1 depicts an exemplary size distribution of a mass of multicellular microspheres of the present invention. FIGS. 2a to 2d depict, through a series of views, a representative microsphere having a plurality of cavities.

The multicellular microspheres may be formed from a variety of polymeric materials. For example, the multicellular polymeric microspheres comprise a vinyl polymer such as polystyrene or polyacrylate, a polyether such as epoxy, a cresolic or phenolic resin, a polyimide, a polyamide, a polyurethane, a polyester, a polyphenylene oxide, a polysulfone, a polyetherimide, polyacetal, polycarbonate or combinations thereof such as polyimide ether or combinations thereof such as polyimideether.

Regardless of the material from which they are formed, the multicellular microspheres are preferably chemically crosslinked to display high mechanical strength, thermal stability, and compressive strength. For example, the microspheres preferably exhibit a median compressive strength of at least about 200 psi (about 13.75 Bar), preferably at least about 400 psi (about 27.5 Bar), more preferably at least about 1,000 to about 4,000 psi (about 70 to about 275 Bar). In addition, the multicellular microspheres preferably have a liquid density of less than 1.4 g/ml, more preferably less than 0.6 g/ml and, in some embodiments about 0.1 to about 1.1 g/ml.

In one embodiment, the multicellular microspheres are selected from commercially available, conventional solid phase supports, chromatographic media, separation supports, and the like. Solid phase supports are typically used for immobilization, catalysis, etc. Chromatographic media and separation supports are typically used for separation and purification of a mixture of chemicals. Multicellular, hollow spheres such as BJO-0840 and EPO-0360 microspheres commercially available from Asia Pacific Microspheres Sdn Bhd, are used as extenders in adhesives, abrasive/grinding wheels to control porosity in the grinding wheels, to aid in stabilizing the dimension of the wheel during process, as a spacer relative to the abrasive particles, thermosetting putty, sensitized dynamite, and syntactic foams. In general, such materials are multicellular, are highly crosslinked and have adequate thermal and compressive strengths. In addition, the variety of commercially available polymeric microspheres enable the selection of those having an affinity for the specific matrix material used in the desired application. This affinity lends itself to improved interfacial adhesion between the multicellular polymeric beads and the resin matrix. Unlike the previous inventions using glass microspheres, chemical surface modification is not required in many cases to achieve an acceptable interface between the sphere and resin matrix.

In general, the multicellular microspheres may be dispersed within any resin to form a multicellular microsphere-filled resin which is suitable for use in printed circuit board applications. For example, multicellular microsphere-filled resins may comprise thermosetting resins such as epoxy, phenolic resin, benzoxazine, polyimide, cyanate ester, bis-maleimide triazine, polyester, polyphenylene ether resins, polystyrene, polyphenylene oxide, polyphenylene sulfide, polysulfone, polyethersulfone, polyetherimide, polyacetal, polycarbonate and the co-polymers and blends thereof. Typically, the multicellular microspheres comprise up to about 30% by weight of the multicellular microsphere-filled resin; in one embodiment, the multicellular microspheres preferably comprise at least about 20 wt. % of the filled resin, more preferably comprise at least about 10 wt. % of the filled resin, and still more preferably comprise about 5 to about 15 wt % of the filled resin.

In addition to multicellular microspheres, the resin may additionally comprise a variety of additives, individually or in the various combinations and permutations thereof. For example, the resin may optionally comprise an ultraviolet light blocking dye, a pigment (such as $TiO_2$, $Fe_2O_3$) or resin to increase the opacity of the pre-preg, laminate or printed circuit board to ultraviolet light. The resin may also optionally comprise a flame retardant, for example, a halogen compound such as a brominated epoxy or brominated filler, or a halogen-free compound such as a phosphorus, nitrogen, or boron containing compound to increase the fire or flame-resistance. The resin may optionally comprise a surfactant such as Chemie BYK 322, an inorganic flow modifier such as hydrophobic fumed silica, and/or a thixotropy agent. Typically, these additive(s) will, in combination, comprise about 3 wt. % to about 20 wt. % of the multicellular microsphere-filled resin. If the halogen substance is an epoxy resin, the bromine comprises 15% to 60% by weight of said resin, and about 5% to 30% by weight of the total solid content. If the halogen substance is a filler, the bromine comprises 20% to 85% by weight of said filler, and 5% to 30% by weight of the total solid content.

Pre-pregs of the present invention are formed by impregnating a reinforcing material with a varnish comprising (i) solvent, (ii) multicellular microspheres, and (iii) a polymeric resin (typically partially cured) or resin monomer. The reinforcing material selected generally depends upon the desired properties for the finished laminate. These include thickness, dielectric constant (Dk), coefficient of thermal expansion ("CTE"), and the intended product application. In general, the reinforcing material may be a woven or non-woven mat comprising a fibrous material such as ceramic, glass, or polymeric fibers. Low dielectric constant materials such as electronics grade glass, D-glass, aramids such as Kevlar® and Nomex®, both registered trademarks of E. I. Dupont de Nemours and Company, poly p-phenylene benzobisthiazole, poly p-phenylene benzobisoxazole, polyetheretherketone, PTFE, aromatic polyesters, quartz, S-glass, paper, and the like, or combinations thereof may be used to form the mat of fibrous material. The reinforcing material may be in a cowoven or comingled form.

The laminates of the present invention are prepared from pre-pregs using conventional techniques such as flat bed press or autoclave lamination. For example, prepreg sheets are sandwiched between two sheets of copper and laminated under heat and pressure (e.g., about 188° C. and 200–600 psi (about 13.75–40 Bar). Copper lines providing electrical pathways can be etched on to the resulting laminate. These can be used as a single substrate or pressed with other sheets of laminate, copper, and prepreg to produce a multi-layer laminate or printed circuit board.

The resulting laminate preferably has a relatively low dielectric constant. That is, the laminate preferably has a dielectric constant of less than 4.2 at 50% resin content. In some embodiments, the dielectric constant is preferably less than 3.9 at 50% resin content, more preferably less than 3.5 at 50% resin content, and may be no greater than 3.0 at 50% resin content.

Pre-pregs, laminates and printed circuit boards incorporating multicellular microspheres may be prepared in accordance with the present invention with only minimal adaptation to existing equipment and methods. For example, prepreg is most often produced on treaters. The main components of a treater include feeder rollers, a resin impregnation tank, a treater oven, and receiver rollers. The reinforcing fabric (E-glass, for example) is usually rolled into a large spool. The spool is then put on the feeder rollers which turn and slowly roll out the glass. The glass then moves through the resin impregnation tank, which contains the varnish. The varnish wets out the glass. After emerging from the tank, the coated glass moves upward through the vertical treater oven which is typically at a temperature of about 350 to 400° F. (about 175° C. to 200° C.), and the solvent of the varnish is boiled away. The resin begins to polymerize at this time. When the composite comes out of the tower it is sufficiently cured so that the web is not wet or tacky. The cure process, however, is stopped short of completion so that additional curing can occur when laminate is made. The web then rolls the prepreg onto the receiver rolls which can be changed when the run is finished. A new roll is then attached to the treater so that a new run can begin.

The laminate prepared in accordance with the present invention have enhanced electrical properties such as a relatively low dielectric constant under very low load of multicellular polymeric beads, improved thermal properties such as higher decomposition temperature, better T-260 and T-288 properties, as well as improved mechanical properties such as thermal expansion characteristics (CTE and Z axis expansion). The prepreg and laminate prepared by this method also have improved machinability, low density, and processability with only minor adaptations to the existing equipment/methods of prepreg manufacture. In particular, the multicellular polymeric beads used in the present invention compare favorably to traditional glass microspheres. Whereas glass typically has a Dk of approximately 6.6, the variety of polymer materials used to produce the multicellular polymeric beads can range in Dk from 2.5 to 4, reducing the bulk Dk of the prepreg even further.

The density of prepreg and laminate will decrease with the addition of porous or hollow polymeric beads as the entrapped gas will displace resin in the final body. This is advantageous in applications where weight is a factor (such as in portable consumer electronics and large size printed circuit board backplanes).

This invention can be used with both passive and active components of printed circuit boards. The resulting prepreg and laminate have electrical, thermal, mechanical, and processable advantages as well as homogeneity in drilling and other printed circuit board machining operations over the glass microspheres.

Having described the invention in general terms, objects and advantages of the invention are more specifically illustrated by the following examples. The particular materials and amounts thereof recited in the examples, as well as other conditions and details, should not be construed to unduly limit this invention.

EXAMPLE 1

Formulation #1

The varnish contained 190 g of Shell Chemical's CS 375, which was mixed with 0.5 g 2-methyl imidazole in 3.6 g methyl ethyl ketone, and 7.2 g 1-methoxy-2-propanol. The mixture was then well stirred for 4 hours, and applied to 7628 style E-glass fabric (supplied by BGF industries). The glass fabric was then brought to the partially cured B-staged by heating at 171° C. for two and a half minutes. A four ply laminate was made, with size 1 oz. STD copper from Gould Foils Inc. on one side and 1 oz. DST copper Gould Foils Inc. on another side, by pressing the prepreg and copper in a book at 188° C. and 140 psi for 90 minutes.

Formulation #2

The varnish contained 150 g (71% solid) of the varnish in Formulation #1 plus 8 g highly porous polymeric beads such as BJO-0840 and 0.3 g surfactant Chemie BYK 322 in 2.7 g 1-methoxy-2-propanol. The mixture was then well stirred for 1 hours, and applied to 7628 style E-glass fabric (supplied by BGF industries). The glass fabric was then brought to the partially cured B-staged by heating at 171° C. for two and a half minutes. A four ply laminate was made, with size 1 oz. STD copper from Gould Foils Inc. on one side and 1 oz. DST copper Gould Foils Inc. on another side, by pressing the prepreg and copper in a book at 188° C. and 140 psi for 90 minutes.

A comparison of selected properties of Formulations #1 and #2 are listed in Table I.

TABLE 1

Comparison of Selected Properties of Formulations #1 and #2

|  | Formulation #1 | Formulation #2 |
|---|---|---|
| Dk @ 1 MHz | 4.6 | 4.2 |
| Resin Content (%) | 44 | 44 |
| Df @ 1 MHz | 0.015 | 0.017 |
| T-260 (min) | >30 | >30 |
| T-288 (min) | 5 | 6 |
| Z-CTE pre-Tg (mm/m° C.) | 85 | 51 |
| Z-CTE post-Tg (mm/m° C.) | 367 | 278 |
| Z-Expansion (%) | 4.2 | 3.0 |
| Tg by DSC (° C.) | 140 | 141 |
| Decomposition Temperature by TGA (° C.) | 328 | 331 |
| Flammability | V0 | V0 |
| Press Cycle Hold Time (min) | 90 | 90 |
| Press Cycle Temperature (° C.) | 188 | 188 |

From these results obvious advantages in the dielectric constant (Dk), and Z-axis expansion were realized with the addition of a small fraction of polymeric microspheres.

EXAMPLE 2

Formulation #3

The varnish contained 89 g Shell Chemical's RSM 3614, which was mixed with 28 g phenolic novolac resin (Such as Borden SD-1 703), and 0.1 g 2-methyl imdazole in 24 g acetone, 27 g 1-methoxy-2-propanol, and 5 g methyl ethyl ketone. The mixture was then well stirred for 4 hours, and applied to 7628 style E-glass fabric (supplied by BGF industries). The glass fabric was then brought to the partially cured B-staged by heating at 171° C. for one minute. A four ply laminate was made, with size 1 oz. STD copper from Gould Foils Inc. on one side and 1 oz. DST copper Gould Foils Inc. on another side, by pressing the prepreg and copper in a book at 188° C. and 140 psi for 90 minutes.

Formulation #4

The varnish contained 143 g (70% solid) of the varnish in Formulation #3 plus 5 g highly porous polymeric beads such as BJO-0840 and 0.9,g surfactant Chemie BYK 322 in 8.1 g 1-methoxy-2-propanol. The mixture was then well stirred for 1 hours, and applied to 7628 style E-glass fabric (supplied by BGF industries). The glass fabric was then brought to the partially cured B-staged by heating at 171° C. for one minute. A four ply laminate was made, with size 1 oz. STD copper from Gould Foils Inc. on one side and 1 oz. DST copper Gould Foils Inc. on another side, by pressing the prepreg and copper in a book at 188° C. and 140 psi for 90 minutes.

A comparison of selected properties of Formulations #3 and #4 appear in Table II.

TABLE II

Comparison of Selected Properties of Formulations #3 and #4

|  | Formulation #3 | Formulation #4 |
|---|---|---|
| Dk @ 1 MHz | 4.8 | 4.2 |
| Resin Content (%) | 42 | 42 |
| Df @ 1 MHz | 0.011 | 0.016 |
| T-260 (min) | >30 | >30 |
| Z-CTE pre-Tg (mm/m° C.) | 40 | 28 |
| Z-CTE post-Tg (mm/m° C.) | 225 | 156 |
| Z-Expansion (%) | 1.6 | 1.5 |
| Decomposition Temperature by TGA (° C.) | 331 | 331 |
| Flammability | V0 | V0 |
| Press Cycle Hold Time (min) | 90 | 90 |
| Press Cycle Temperature (° C.) | 188 | 188 |

Similar to example 1, there are obvious advantages for using this technique with respect to the dielectric constant (Dk), and Z-axis expansion of the final laminate.

EXAMPLE 3

Formulation #5

The varnish contained 53 g of a 50%—50% mixture by weight of 1-methoxy-2-propanol to N,N-dimethylformamide and, 4.4 g dicyandiamide, which was mixed with 198 g of Shell Chemical's CS 350 Resin and 1.2 g 2-methyl imidazole. The mixture was then well stirred for 4 hours, and applied to 7628 style E-glass fabric (supplied by BGF industries). The glass fabric was then brought to the partially cured B-staged by heating at 171° C. for two and a half minutes. A four ply laminate was made, with size 1 oz. STD copper from Gould Foils Inc. on one side and 1 oz. DST copper Gould Foils Inc. on another side, by pressing the prepreg and copper in a book at 188° C. and 140 psi for 90 minutes.

Formulation #6

The varnish contained 150 g (62% solid) of the varnish in Formulation #5 plus 7 g highly porous polymeric beads such as BJO-0840 and 0.3 g surfactant Chemie BYK 322 in 20 g 1-methoxy-2-propanol. The mixture was then well stirred for 1 hours, and applied to 7628 style E-glass fabric (supplied by BGF industries). The glass fabric was then brought to the partially cured B-staged by heating at 171° C. for two and a half minutes. A four ply laminate was made, with size 1 oz. STD copper from Gould Foils Inc. on one side and 1 oz. DST copper Gould Foils Inc. on another side, by pressing the prepreg and copper in a book at 188° C. and 140 psi for 90 minutes.

A comparison of selected properties of Formulations #5 and #6 appear in Table III.

TABLE III

Comparison of Selected Properties of Formulations #5 and #6

|  | Formulation #5 | Formulation #6 |
|---|---|---|
| Dk @ 1 MHz | 4.9 | 4.4 |
| Resin Content (%) | 35 | 35 |
| Df @ 1 MHz | 0.009 | 0.012 |
| T-260 (min) | 17 | >30 |
| T-288 (min) | 1 | 6 |
| Tg by DSC (° C.) | 132 | 141 |

TABLE III-continued

Comparison of Selected Properties of Formulations #5 and #6

|  | Formulation #5 | Formulation #6 |
| --- | --- | --- |
| Decomposition Temperature by TGA (° C.) | 307 | 331 |
| Flammability | V0 | V0 |
| Press Cycle Hold Time (min) | 90 | 90 |
| Press Cycle Temperature (° C.) | 188 | 188 |

From these results obvious advantages in the dielectric constant (Dk), T-260, T-288, Tg, decomposition temperature were realized with the addition of a small fraction of polymeric microspheres.

EXAMPLE 4

Formulation #7

The varnish contained 143 g benzoxazine from Georgia-Pacific (70% solid in methyl ethyl ketone), 5 g Vantico ECN 9511, and 15 g Shell Chemical Epon 1 163. The mixture was then well stirred for 4 hours, and applied to 7628 style E-glass fabric (supplied by BGF industries). The glass fabric was then brought to the partially cured B-staged by heating at 171° C. for two and a half minutes. A four ply laminate was made, with size 1 oz. STD copper from Gould Foils Inc. on one side and 1 oz. DST copper Gould Foils Inc. on another side, by pressing the prepreg and copper in a book at 188° C. and 140 psi for 90 minutes. The dielectric constant and dissipation factor at 1 MHz are 4.6 and 0.008 respectively under 39% resin content.

Formulation #8

The varnish contained 143 g of the varnish in Formulation #7 plus 10 g highly porous polymeric beads such as BJO-0840. The mixture was then well stirred for 1 hours, and applied to 7628 style E-glass fabric (supplied by BGF industries). The glass fabric was then brought to the partially cured B-staged by heating at 171° C. for two and a half minutes. A four ply laminate was made, with size 1 oz. STD copper from Gould Foils Inc. on one side and 1 oz. DST copper Gould Foils Inc. on another side, by pressing the prepreg and copper in a book at 188° C. and 140 psi for 90 minutes. The dielectric constant and dissipation factor at 1 MHz are 3.8 and 0.004 respectively under 37% resin content.

Formulation #8 has a depressed dielectric constant as compared to Formulation #7; otherwise, the two formulations are similar.

EXAMPLE 5

Formulation #9

The varnish RD2000 halogen-free benzoxazine package from Vantico was applied to 7628 style E-glass fabric (supplied by BGF industries). The glass fabric was then brought to the partially cured B-staged by heating at 171° C. for two and a half minutes. A four ply laminate was made, with size 1 oz. STD copper from Gould Foils Inc. on one side and 1 oz. DST copper Gould Foils Inc. on another side by pressing the prepreg and copper in a book at 204° C. and 140 psi for 120 minutes. The dielectric constant at 1 MHz is 5.1 under 31% resin content.

Formulation #10

The varnish contained 250g of the varnish in Formulation #9 plus 13 g highly porous polymeric beads such as BJO-0840. The mixture was then well stirred for 1 hours, and applied to 7628 style E-glass fabric (supplied by BGF industries). The glass fabric was then brought to the partially cured B-staged by heating at 171° C. for two and a half minutes. A four ply laminate was made, with size 1 oz. STD copper from Gould Foils Inc. on one side and 1 oz. DST copper Gould Foils Inc. on another side, by pressing the prepreg and copper in a book at 204° C. and 140 psi for 120 minutes. The dielectric constant at 1 MHz is 4.5 under 31% resin content.

Formulation #10 has a depressed dielectric constant as compared to Formulation #9; otherwise, the two formulations are similar.

EXAMPLE 6

Formulation #11

The varnish RD2000 LD benzoxazine package from Vantico was applied to 7628 style E-glass fabric (supplied by BGF industries). The glass fabric was then brought to the partially cured B-staged by heating at 171° C. for one minute. A four ply laminate was made, with size 1 oz. STD copper from Gould Foils Inc. on one side and 1 oz. DST copper Gould Foils Inc. on another side, by pressing the prepreg and copper in a book at 204° C. and 140 psi for 120 minutes.

Formulation #12

The varnish contained 240g of the varnish in Formulation #11 plus 12 g highly porous polymeric beads such as BJO-0840 and 0.3 g surfactant Chemie BYK 322 in 2.7 g 1-methoxy-2-propanol. The mixture was then well stirred for 1 hours, and applied to 7628 style E-glass fabric (supplied by BGF industries). The glass fabric was then brought to the partially cured B-staged by heating at 171° C. for one minute. A four ply laminate was made, with size 1 oz. STD copper from Gould Foils Inc. on one side and 1 oz. DST copper Gould Foils Inc. on another side, by pressing the prepreg and copper in a book at 204° C. and 140 psi for 120 minutes.

A comparison of selected properties of Formulations #11 and #12 appear in Table IV.

TABLE IV

Comparison of Selected Properties of Formulations #11 and #12

|  | Formulation #11 | Formulation #12 |
| --- | --- | --- |
| Dk @ 1 MHz | 4.3 | 4.0 |
| Resin Content (%) | 46 | 46 |
| Df @ 1 MHz | 0.004 | 0.006 |
| T-260 (min) | >30 | >30 |
| T-288 (min) | >30 | >30 |
| Tg by DSC (° C.) | 178 | 187 |
| Decomposition Temperature by TGA (° C.) | 327 | 340 |
| Flammability | V0 | V0 |
| Press Cycle Hold Time (min) | 120 | 120 |
| Press Cycle Temperature (° C.) | 204 | 204 |

From these results demonstrable advantages in the dielectric constant (Dk), Tg, decomposition temperature were realized with the addition of a small fraction of polymeric microspheres.

What is claimed is:

1. A filled prepreg composition comprising a reinforcing material impregnated with (i) a polymeric resin, and (ii) multicellular polymeric microspheres comprising at least two open or closed cavities as a filler.

2. The filled prepreg of claim 1 wherein the polymeric resin comprises a surfactant.

3. The filled prepreg of claim 1 wherein 95% of the multicellular polymeric microspheres have a diameter which is no greater than 70 micrometers.

4. The filled prepreg of claim 1 wherein 95% of the multicellular polymeric microspheres have a diameter which is no greater than 25 micrometers.

5. The filled prepreg of claim 1 wherein the multicellular polymeric microspheres have a mean diameter which is no greater than 10 micrometers.

6. The filled prepreg of claim 1 wherein the multicellular polymeric microspheres have a mean diameter less than 25 micrometers and 95% have a diameter which is no greater than 70 micrometers.

7. The filled prepreg of claim 1 wherein the multicellular polymeric microspheres have a mean diameter less than 10 micrometers and 95% have a diameter which is no greater than 70 micrometers.

8. The filled prepreg of claim 1 wherein the multicellular polymeric microspheres have a liquid density of no more than 1.4 g/ml.

9. The filled prepreg of claim 8 wherein 95% of the multicellular polymeric microspheres have a diameter which is no greater than 70 micrometers.

10. The filled prepreg of claim 8 wherein 95% of the multicellular polymeric microspheres have a diameter which is no greater than 25 micrometers.

11. The filled prepreg of claim 8 wherein the multicellular polymeric microspheres have a mean diameter which is no greater than 10 micrometers.

12. The filled prepreg of claim 8 wherein the multicellular polymeric microspheres have a mean diameter less than 25 micrometers and 95% have a diameter which is no greater than 70 micrometers.

13. The filled prepreg of claim 8 wherein the multicellular polymeric microspheres have a mean diameter less than 10 micrometers and 95% have a diameter which is no greater than 70 micrometers.

14. The filled prepreg of claim 1 wherein the multicellular polymeric microspheres have a liquid density of no more than 0.6 g/ml.

15. The filled prepreg of claim 14 wherein 95% of the multicellular polymeric microspheres have a diameter which is no greater than 70 micrometers.

16. The filled prepreg of claim 14 wherein 95% of the multicellular polymeric microspheres have a diameter which is no greater than 25 micrometers.

17. The filled prepreg of claim 14 wherein the multicellular polymeric microspheres have a mean diameter which is no greater than 10 micrometers.

18. The filled prepreg of claim 14 wherein the multicellular polymeric microspheres have a mean diameter less than 25 micrometers and 95% have a diameter which is no greater than 70 micrometers.

19. The filled prepreg of claim 14 wherein the multicellular polymeric microspheres have a mean diameter less than 10 micrometers and 95% have a diameter which is no greater than 70 micrometers.

20. The filled prepreg of claim 1 wherein the multicellular polymeric microspheres have a liquid density of about 0.1 g/ml.

21. The filled prepreg of claim 1 wherein the multicellular polymeric microspheres have a liquid density of about 0.1 to about 1.1 g/ml.

22. The filled prepreg of claim 1 wherein the multicellular polymeric microspheres display a compressive strength between 400 and 4,000 lbs/in$^2$ (27.5 Bar and about 275 Bar).

23. The filled prepreg of claim 1 wherein the multicellular polymeric microspheres comprise a vinyl, polyacrylate, polyamide, polyimide, polyurethane, polyester, polyether, cresolic, or phenolic polymer.

24. The filled prepreg of claim 23 wherein 95% of the multicellular polymeric microspheres have a diameter which is no greater than 70 micrometers.

25. The filled prepreg of claim 23 wherein 95% of the multicellular polymeric microspheres have a diameter which is no greater than 25 micrometers.

26. The filled prepreg of claim 23 wherein the multicellular polymeric microspheres have a mean diameter which is no greater than 10 micrometers.

27. The filled prepreg of claim 23 wherein the multicellular polymeric microspheres have a mean diameter less than 25 micrometers and 95% have a diameter which is no greater than 70 micrometers.

28. The filled prepreg of claim 23 wherein the multicellular polymeric microspheres have a mean diameter less than 10 micrometers and 95% have a diameter which is no greater than 70 micrometers.

29. The filled prepreg of claim 23 wherein 95% of the multicellular polymeric microspheres have a diameter which is no greater than 70 micrometers and the pre-preg comprises a flame retardant composition.

30. The filled prepreg of claim 23 wherein the pre-preg comprises a flame retardant composition.

31. The filled prepreg of claim 1 wherein the pre-preg comprises a flame retardant composition.

32. The filled prepreg of claim 31 wherein the flame retardant composition comprises a halogenated compound.

33. The filled prepreg of claim 31 wherein the flame retardant composition comprises a brominated epoxy or brominated filler.

34. The filled prepreg of claim 31 wherein the flame retardant composition comprises a phosphorus, nitrogen, or boron containing compound.

35. The filled prepreg of claim 1 wherein the pre-preg comprises an epoxy resin containing about 15% to 60% by weight bromine.

36. The filled prepreg of claim 1 wherein the pre-preg comprises a UV blocking dye.

37. The filled prepreg of claim 1 wherein the pre-preg comprises pigments.

38. The filled prepreg of claim 1 wherein the pre-preg comprises a flow modifier.

39. The filled prepreg of claim 1 wherein said polymeric resin is selected from the group consisting of epoxy, phenolic, benzoxazine, polyimide, cyanate ester, bismaleimide triazine, polyester, and polyphenylene ether resins.

40. The filled prepreg of claim 39 wherein the multicellular polymeric microspheres comprise a vinyl, polyacrylate, polyamide, polyimide, polyurethane, polyester, polyether, cresolic, or phenolic polymer.

41. The filled prepreg of claim 40 wherein 95% of the multicellular polymeric microspheres have a diameter which is no greater than 70 micrometers.

42. The filled prepreg of claim 40 wherein 95% of the multicellular polymeric microspheres have a diameter which is no greater than 25 micrometers.

43. The filled prepreg of claim 40 wherein the multicellular polymeric microspheres have a mean diameter which is no greater than 10 micrometers.

44. The filled prepreg of claim 40 wherein the multicellular polymeric microspheres have a mean diameter less than 25 micrometers and 95% have a diameter which is no greater than 70 micrometers.

45. The filled prepreg of claim 40 wherein the multicellular polymeric microspheres have a mean diameter less than 10 micrometers and 95% have a diameter which is no greater than 70 micrometers.

46. The filled prepreg of claim 40 wherein the reinforcing material is selected from the group consisting of electronics grade glass, quartz, aramid, paper and PTFE.

47. The filled prepreg of claim 39 wherein the reinforcing material is selected from the group consisting of electronics grade glass, quartz, aramid, paper and PTFE.

48. The filled prepreg of claim 1 wherein the reinforcing material is selected from the group consisting of electronics grade glass, quartz, aramid, paper and PTFE.

49. A conductor-clad substrate comprising the composition of claim 1, 2, 3, 8, 9, 22, 23, 24, 31, 32, 39, 40, 41, 46, 47, or 48.

50. A printed circuit board comprising the composition of claim 1, 2, 3, 8, 9, 22, 23, 24, 31, 32, 39, 40, 41, 46, 47, or 48.

51. A process for the preparation of a filled prepreg composition, the process comprising the following steps in the specified order: (i) impregnating a reinforcing material with a varnish, the varnish containing a solvent, multicellular polymeric microspheres composing at least two open or closed cavities as a filler, and a monomer or a polymeric resin which is partially cured, (ii) evaporating solvent from the impregnated reinforcing material, and (iii) optionally heating the impregnated material to cure the monomer or further cure the polymeric resin to form a pre-preg.

52. The process of claim 51 wherein the polymeric resin comprises a surfactant.

53. The process of claim 51 wherein 95% of the multicellular polymeric microspheres have a diameter which is no greater than 70 micrometers.

54. The process of claim 51 wherein 95% of the multicellular polymeric microspheres have a diameter which is no greater than 25 micrometers.

55. The process of claim 51 wherein the multicellular polymeric microspheres have a mean diameter which is no greater than 10 micrometers.

56. The process of claim 51 wherein the multicellular polymeric microspheres have a mean diameter less than 25 micrometers and 95% have a diameter which is no greater than 70 micrometers.

57. The process of claim 51 wherein the multicellular polymeric microspheres have a mean diameter less than 10 micrometers and 95% have a diameter which is no greater than 70 micrometers.

58. The process of claim 51 wherein the multicellular polymeric microspheres have a liquid density of no more than 1.4 g/ml.

59. The process of claim 51 wherein the multicellular polymeric microspheres have a liquid density of no more than 0.6 g/ml.

60. The process of claim 51 wherein the multicellular polymeric microspheres have a liquid density of about 0.1 g/ml.

61. The process of claim 51 wherein the multicellular polymeric microspheres have a liquid density of about 0.1 to about 1.1 g/ml.

62. The process of claim 51 wherein the multicellular polymeric microspheres display a compressive strength between 400 and 4,000 lbs/in$^2$ (27.5 Bar and about 275 Bar).

63. The process of claim 51 wherein the multicellular polymeric microspheres comprise a vinyl, polyacrylate, polyamide, polyimide, polyurethane, polyester, polyether, cresolic, or phenolic polymer.

64. The process of claim 51 wherein the varnish contains a polymeric resin selected from the group consisting of epoxy, phenolic, benzoxazine, polyimide, cyanate ester, bismaleimide triazine, polyester, and polyphenylene ether resins.

65. The process of claim 51 wherein the varnish contains a monomer or a mixture of monomers which, upon polymerization, form a polymeric resin selected from the group consisting of epoxy, phenolic, benzoxazine, polyimide, cyanate ester, bismaleimide triazine, polyester, and polyphenylene ether resins.

* * * * *